US008551856B2

(12) United States Patent
Rennie et al.

(10) Patent No.: US 8,551,856 B2
(45) Date of Patent: Oct. 8, 2013

(54) EMBEDDED CAPACITOR AND METHOD OF FABRICATING THE SAME

(75) Inventors: Michael Rennie, Mechanicsville, VA (US); Thomas J. Knight, Silver Spring, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 55 days.

(21) Appl. No.: 13/240,748

(22) Filed: Sep. 22, 2011

(65) Prior Publication Data

US 2013/0075862 A1    Mar. 28, 2013

(51) Int. Cl.
*H01L 21/20* (2006.01)
*H01L 21/02* (2006.01)

(52) U.S. Cl.
USPC .... 438/396; 438/381; 257/532; 257/E21.008; 257/E25.014; 257/E27.048; 257/E27.071

(58) Field of Classification Search
None
See application file for complete search history.

(56) References Cited

U.S. PATENT DOCUMENTS

| | | |
|---|---|---|
| 6,391,707 B1 | 5/2002 | Dirnecker et al. |
| 6,593,185 B1 | 7/2003 | Tsai et al. |
| 6,768,154 B2 | 7/2004 | Miyajima |
| 6,815,747 B2 | 11/2004 | Kosugi et al. |
| 6,949,786 B2 | 9/2005 | Miyajima |
| 7,247,537 B2 | 7/2007 | Park |
| 7,271,055 B2 | 9/2007 | Lee et al. |
| 7,655,968 B2 | 2/2010 | Manning |
| 7,700,433 B2 | 4/2010 | Hwang |
| 7,781,820 B2 | 8/2010 | Sugioka |
| 2005/0205918 A1* | 9/2005 | Abiko ............................ 257/303 |
| 2005/0282346 A1 | 12/2005 | Barth et al. |
| 2006/0120020 A1* | 6/2006 | Dowgiallo ..................... 361/313 |
| 2006/0148170 A1* | 7/2006 | Kim ............................... 438/253 |
| 2007/0287247 A1 | 12/2007 | Liu et al. |
| 2009/0159322 A1 | 6/2009 | Wu et al. |
| 2009/0200638 A1 | 8/2009 | Smith |
| 2010/0224925 A1 | 9/2010 | Ching et al. |

OTHER PUBLICATIONS

Gerritsen, et al.: "*Evolution of Materials Technology for Stacked-Capacitors in 65 nm Embedded-DRAM*"; Solid State Electronics 49, 1767-1775 (2005).
International Search Report for corresponding PCT/US12/55151 completed Oct. 22, 2012 by Lee W. Young of the ISA/US.

* cited by examiner

*Primary Examiner* — Evan Pert
*Assistant Examiner* — Joseph Galvin, III
(74) *Attorney, Agent, or Firm* — Tarolli, Sundheim, Covell & Tummino LLP

(57) ABSTRACT

Methods are provided for forming a capacitor. In one embodiment, a method comprises providing an insulator material layer over a substrate, etching at least one via in the insulator material layer and depositing a contact material fill in the at least one via to form a first set of contacts. The method further comprises etching the insulator material layer adjacent at least one contact of the first set of contacts to form at least one void, depositing a dielectric material layer over the at least one void and over the first set of contacts and depositing a contact material fill in the at least void to form a second set of contacts.

18 Claims, 6 Drawing Sheets

EMBEDDED CAPACITOR AND METHOD OF FABRICATING THE SAME

TECHNICAL FIELD

The present invention relates generally to electronics, and more particularly to an embedded capacitor and method of fabricating the same.

BACKGROUND

In many applications, it is desirable to have relatively large capacitance in a small area in a semiconductor device. Therefore, there have been efforts on fabrication of metal-insulator-metal (MIM) capacitors to increase the density of capacitors, while maintaining their relatively large capacitance. Current methods for forming MIM capacitors are either forming parallel plates of metal with a thin dielectric between them to form vertical capacitors or using the space between metal lines patterns at the same level to form horizontal capacitors. Both of these current methods have the disadvantages of having limited capacitance area and therefore have to be made quite large to obtain the desired capacitance. Furthermore, stacking the capacitors vertically can cause problems with topography and planarization.

SUMMARY

In an aspect of the invention, a method is provided for forming a capacitor. The method comprises providing an insulator material layer over a substrate, etching at least one via in the insulator material layer and depositing a contact material fill in the at least one via to form a first set of contacts. The method further comprises etching the insulator material layer adjacent at least one contact of the first set of contacts to form at least one void, depositing a dielectric material layer over the at least one void and over the first set of contacts and depositing a contact material fill in the at least void to form a second set of contacts.

In another aspect of the invention, a method is provided of forming a semiconductor device with one or more vertical three dimensional metal-insulator-metal (MIM) capacitors. The method comprises providing an insulator material layer over a substrate, etching a plurality of capacitor vias in an embedded capacitor area of the insulator material layer and a plurality of standard interconnect vias in a standard interconnect area and depositing a contact material fill in the plurality of capacitor vias to form a first set of capacitor contacts and in the plurality of standard interconnect vias to form a plurality of standard interconnect contacts. The method further comprises etching the insulator material layer adjacent each of the first set of contacts to form a plurality of adjacent voids, depositing a dielectric material layer over the standard interconnect area, the plurality of adjacent voids and the first set of capacitor contacts, etching away the dielectric material layer that overlies the standard interconnect area and depositing a contact material fill in the plurality of voids to form a second set of capacitor contacts that are interleaved with the first set of capacitor contacts.

In yet a further aspect of the invention, a semiconductor device is provided that includes a vertical three dimensional MIM capacitor. The capacitor comprises a first contact plate, a second contact plate, a first set of contacts connected to the first contact plate and extending through an insulator layer toward the second contact plate and a second set of contacts connected to the second contact plate and extending through the insulator layer toward the first contact plate. The first set of contacts and the second set of contacts are interleaved with one another. The capacitor further comprises a dielectric material that wraps around three sides of a contact of the second set of contacts to three sides of a contact of the first set of contacts in an alternating configuration across the length of the capacitor

DETAILED DESCRIPTION

The present invention is directed to a vertical three-dimensional metal-insulator-metal (MIM) capacitor embedded into a semiconductor device, such as an integrated circuit chip. The capacitor can be formed by etching vias formed in an insulator material layer (e.g., an oxide layer) overlying a bottom contact plate and filling the vias with a contact material in a capacitor area of the semiconductor device to form a first set of contacts. The first set of contacts contact the bottom contact plate, which forms a bottom electrode of the vertical three-dimensional MIM capacitor. Voids can be formed adjacent the contacts of the first set of contacts by etching the insulator material layer. A relatively thin dielectric material layer is then deposited overlying the voids and the first set of contacts to form a dielectric layer for the vertical three-dimensional MIM capacitor. The voids are then filled with a contact material to form a second set of contacts. A top contact plate can be formed over a portion of the dielectric layer and over and coupled to the second set of contacts. The top contact plate forms a top electrode of the vertical three dimensional MIM capacitor.

The vertical three dimensional MIM capacitor provides a large capacitance employing multiple contact points and a large amount of surface area contacting the dielectric layer due to interleaving of the first and second contact patterns. Furthermore, employment of the vertical capacitor in the semiconductor device allows for the semiconductor device to remain planar. Moreover, by forming capacitor contacts with a substantially cylindrical shape in vias of the semiconductor device, the capacitor can be packed densely with other components of the semiconductor device since only the thin dielectric layer will interleave with and separate the first set of contacts coupled to the bottom electrode from the second set of contacts coupled to the top electrode.

Figure 1:
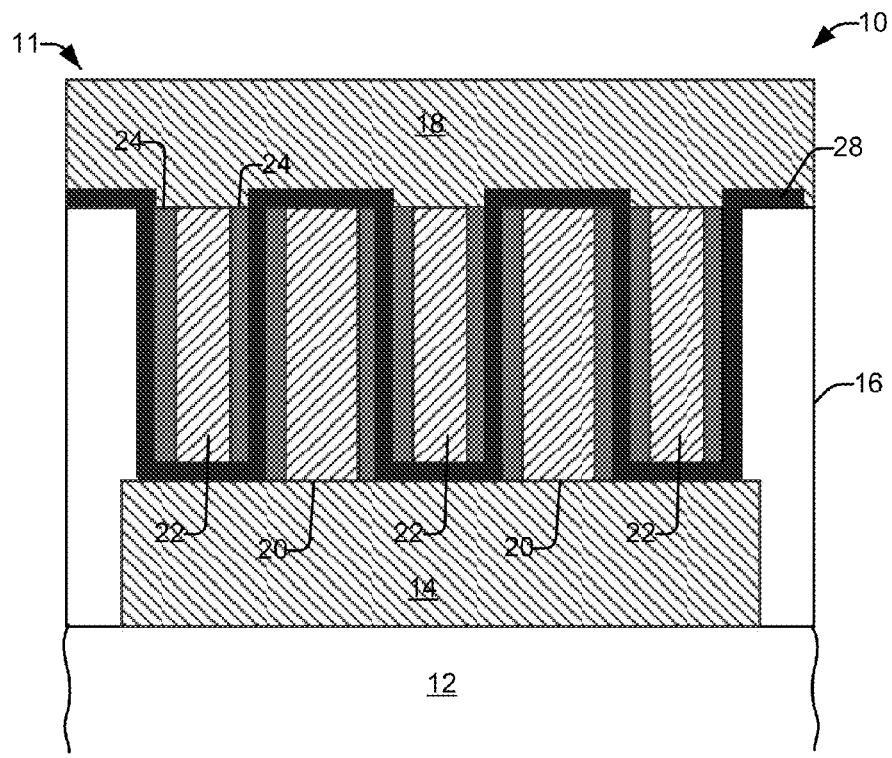
FIG. 1 illustrates a schematic cross-sectional view of a vertical three dimensional metal-insulator-metal (MIM) capacitor assembly in accordance with an aspect of the present invention.

FIG. 1 illustrates a cross-sectional view of a vertical three dimensional MIM capacitor assembly 10 in accordance with an aspect of the present invention. The vertical three dimensional MIM capacitor assembly 10 includes a vertical three dimensional MIM capacitor 11 that resides over a substrate 12. The substrate 12 can be formed of silicon or another substrate material. An insulator material layer 16 (e.g., silicon oxide) overlies the substrate 12 and surrounds a portion of the vertical three dimensional MIM capacitor 11. The vertical three dimensional MIM capacitor 11 includes a bottom contact plate 14 (e.g., aluminum) that resides on top of the substrate 12 and forms a bottom electrode of the capacitor 11. The vertical three dimensional MIM capacitor 11 also includes a top contact plate 18 overlying the insulator material layer 16 that forms a top electrode of the vertical three dimensional MIM capacitor 11. A first set of contacts 20 are coupled to the bottom contact plate 14 and extend toward the top contact plate 18 separated by a dielectric layer 28 (e.g., silicon nitride (SiN), hafnium oxide ($HfO_2$), zirconium oxide ($ZrO_2$), aluminum oxide ($Al_2O_3$), or other dielectric material based on a desired dielectric constant), which forms a dielectric medium of the vertical three dimensional MIM capacitor 11. A second set of contacts 22 are coupled to the top contact plate 18 and extend toward the bottom contact plate 14, which is also separated by the dielectric layer 28. Each of the contacts 20 and 22 are formed from a pair of adhesion liners 24 (e.g., titanium nitride (TiN)) filled with a contact material (Tungsten (W)). The first set of contacts 20 are interleaved with the second set of contacts 22. The dielectric layer 28 wraps around three sides of a contact of the second set of contacts 22 to three sides of a contact of the first set of contacts 20 in an alternating interleaving configuration with the first set of contacts 20 and the second set of contacts 22 across the length of the vertical three dimensional MIM capacitor 11.

Figure 2:
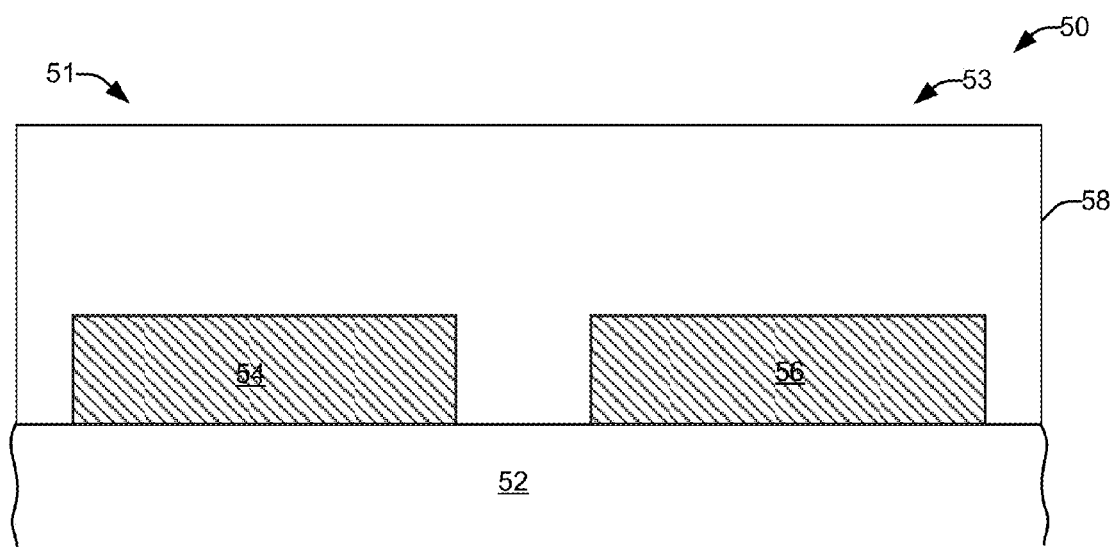
FIG. 2 illustrates a schematic cross-sectional view of a semiconductor structure in its early stages of fabrication in accordance with an aspect of the present invention.

Turning now to FIGS. 2-12, fabrication is discussed in connection with formation of a vertical three dimensional MIM capacitor as illustrated in FIG. 1 in a semiconductor device, such as an integrated circuit. FIG. 2 illustrates a semiconductor structure 50 in its early stages of fabrication. The semiconductor structure 50 includes a standard interconnect area 51 and an embedded capacitor area 53. A bottom portion of standard metal interconnects 54 for standard metal wiring reside in the standard interconnect area 51 and a bottom contact plate 56 resides in the embedded capacitor area 53. The bottom portion of standard metal interconnects 54 and the bottom contact plate 56 can be formed from aluminum based metal interconnects that are deposited over a substrate 52, patterned and etched employing standard photolithography processes. An insulator layer 58 is formed over the bottom portion of standard metal interconnects 54 and the bottom contact plate 56 by depositing an insulator material layer 58 (e.g., Silicon oxide) over the substrate 52 and planarizing the insulator material layer utilizing a standard mechanical polish (CMP) to provide a dielectric between metal layers.

Figure 3:
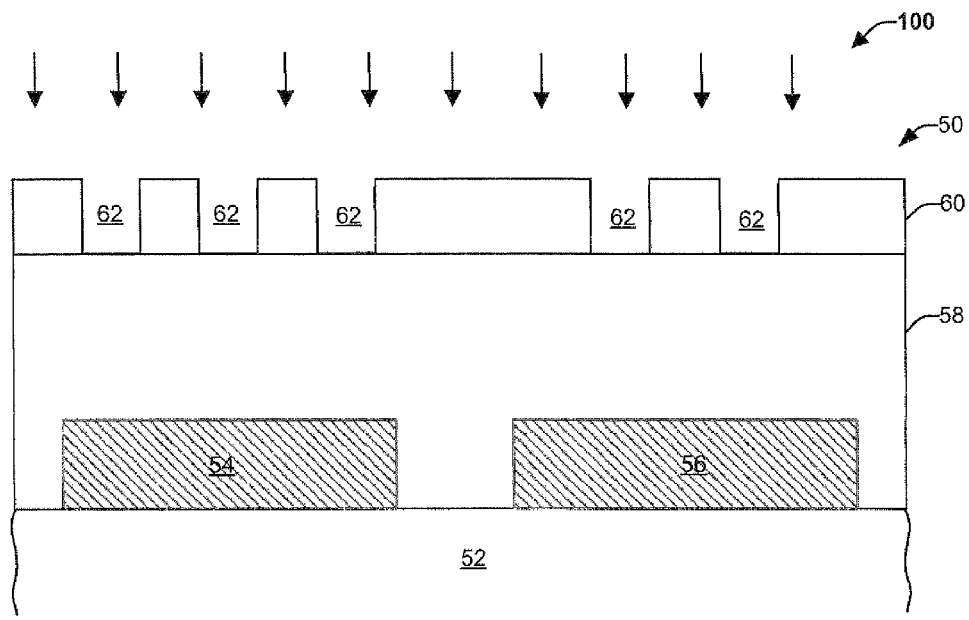
FIG. 3 illustrates a schematic cross-sectional view of the structure of FIG. 2 undergoing an etch step in accordance with an aspect of the present invention.

Next, as represented in FIG. 3, a photoresist material layer 60 is applied to cover the structure 50 and is then patterned and developed to expose open regions 62 in the photoresist material layer 60 in accordance with an opening pattern. The photoresist material layer 60 can have a thickness that varies in correspondence with the wavelength of radiation used to pattern the photoresist material layer 60. The photoresist material layer 60 may be formed over the insulator layer 58 via spin-coating or spin casting deposition techniques, selectively irradiated and developed to form the openings 62.

FIG. 3 also illustrates performing of an etch 100 (e.g., anisotropic reactive ion etching (RIE)) on the insulator layer 58 to form extended openings 64 and 65 (FIG. 4) in the insulator layer 58 based on the opening pattern in the photoresist material layer 60. The etch step 100 can be a dry etch or wet etch that employs an etchant which selectively etches the insulator layer 58 at a faster rate than the underlying bottom portion of standard metal interconnects 54 and bottom contact plate 56 and the overlying photoresist material layer 60. For example, the insulator layer 58 may be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to replicate the mask pattern of the patterned of the photoresist material layer 60 to thereby create standard interconnect vias 64 and a set of capacitor vias 65 (FIG. 4).

Figure 4:
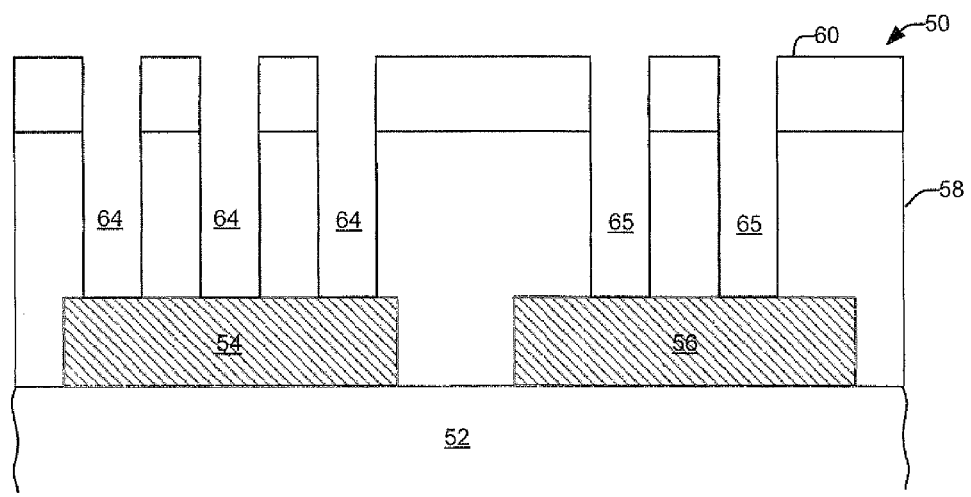
FIG. 4 illustrates a schematic cross-sectional view of the structure of FIG. 3 after undergoing the etch step in accordance with an aspect of the present invention.
Figure 5:
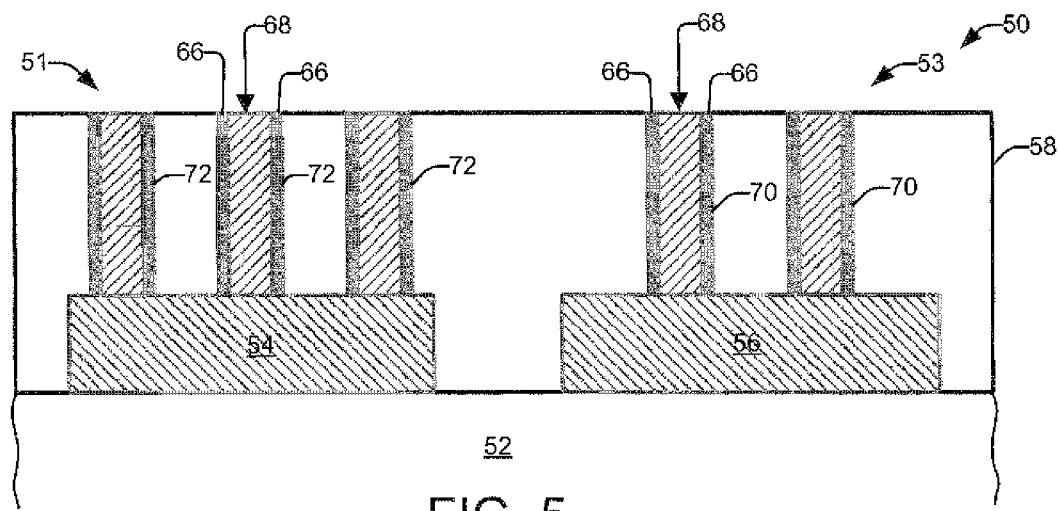
FIG. 5 illustrates the structure of FIG. 4 after undergoing a contact material fill in accordance with an aspect of the present invention.

FIG. 5 illustrates the structure 50 of FIG. 4 after undergoing a stripping step (e.g., ashing in an $O_2$ plasma) to remove the patterned photoresist material layer 60, formation of adhesion liners 66 (e.g., titanium nitride (TiN)) alongside each of the standard metal interconnect vias 64 and the capacitor vias 65 and a contact material fill 68 (e.g., tungsten (W)) in each of the standard metal interconnect vias 64 and the capacitor vias 65 to form a set of standard metal interconnect contacts 72 and a first set of capacitor contacts 70. The adhesion liner 66 may be formed using any suitable technique including chemical vapor deposition (CVD) techniques, such as low pressure chemical vapor deposition (LPCVD) or plasma enhanced chemical vapor deposition (PECVD). The contact material fill 68 can be deposited employing a standard contact material deposition. Following deposition of the contact material fill 68, the contact material fill 68 is polished via chemical mechanical polishing (CMP) down to the surface level of the insulator layer 58.

Figure 6:
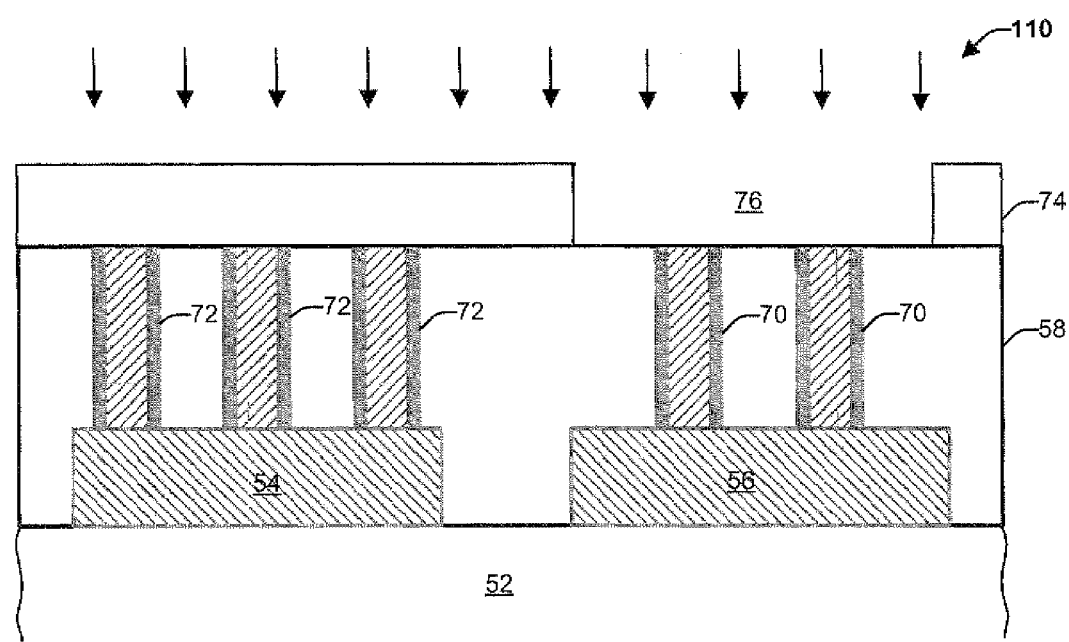
FIG. 6 illustrates a schematic cross-sectional view of the structure of FIG. 5 undergoing an etching step in accordance with an aspect of the present invention.
Figure 7:
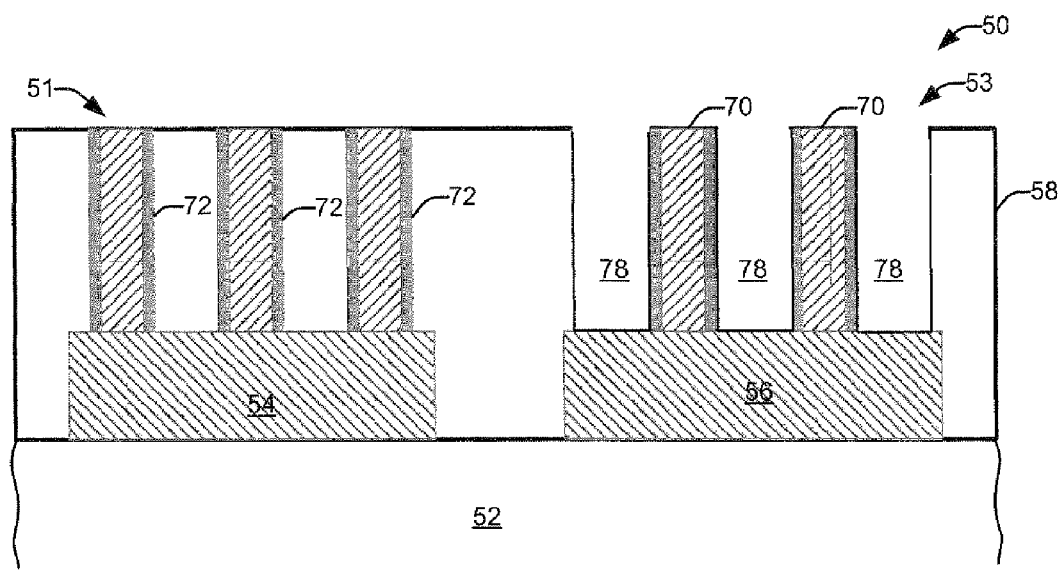
FIG. 7 illustrates a schematic cross-sectional view of the structure of FIG. 6 after undergoing an etching step in accordance with an aspect of the present invention.

Next, as represented in FIG. 6, a photoresist material layer 74 is applied to the structure 50 of FIG. 5 and is then patterned and developed to expose open region 76 in the photoresist material layer 74 overlying the embedded capacitor area 53. An etch 110 (e.g., anisotropic reactive ion etching (RIE)) on the insulator layer 58 is performed to form voids 78 (FIG. 7) in the insulator layer 58 based on the opening pattern in the photoresist material layer 76. The etch step 110 can be a dry etch or wet etch that employs an etchant which selectively etches the insulator layer 74 at a faster rate than the underlying bottom contact plate 56 and the overlying photoresist material layer 74.

Figure 8:
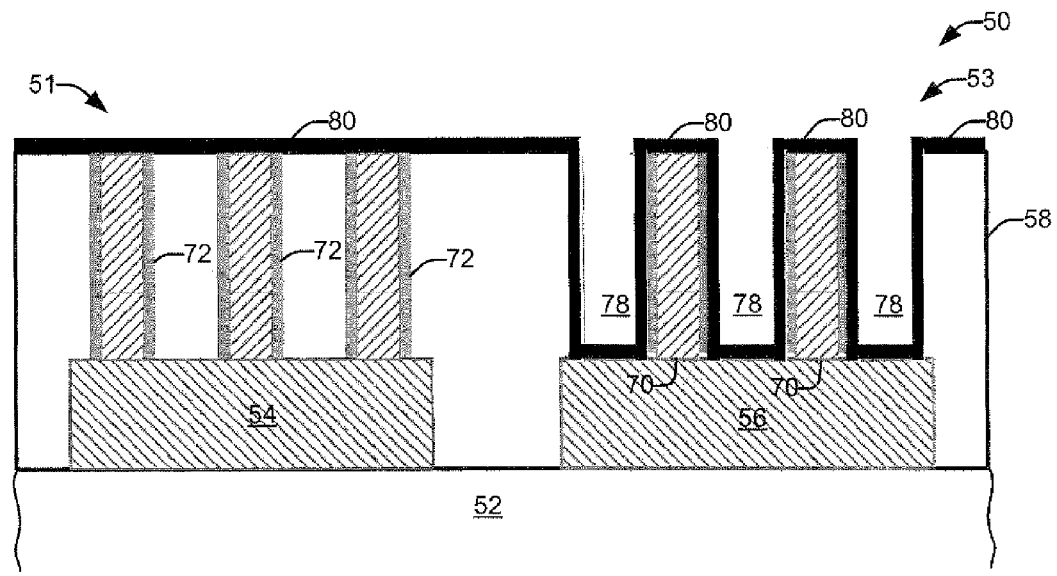
FIG. 8 illustrates a schematic cross-sectional view of the structure of FIG. 7 after undergoing deposition of a dielectric material layer in accordance with an aspect of the present invention.
Figure 9:
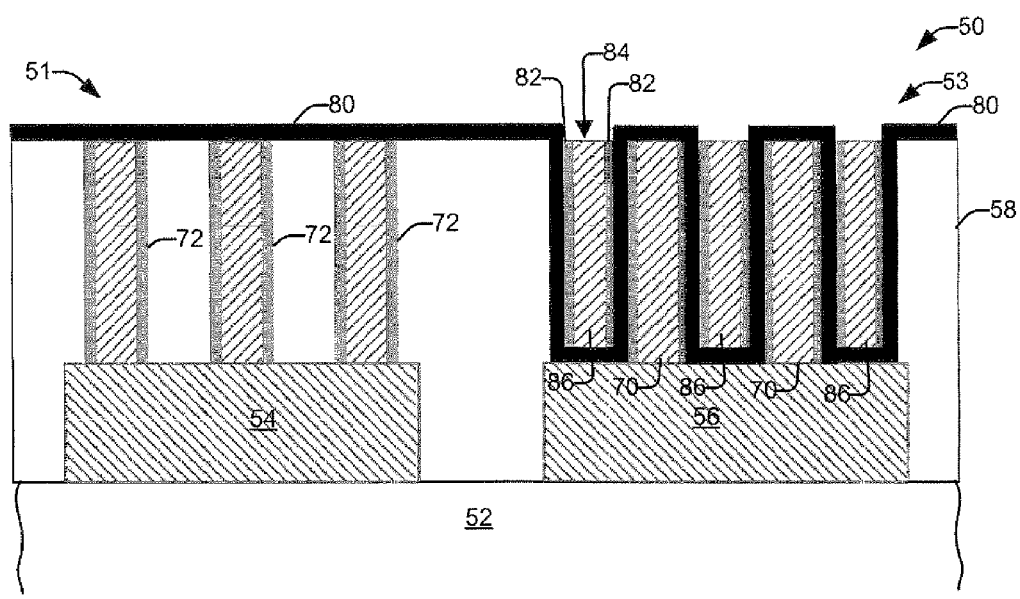
FIG. 9 illustrates a schematic cross-sectional view of the structure of FIG. 8 after undergoing a contact material fill in accordance with an aspect of the present invention.

As illustrated in FIG. 8, a dielectric layer 80 (e.g., silicon nitride (SiN), hafnium oxide ($HfO_2$), zirconium oxide ($ZrO_2$), aluminum oxide ($Al_2O_3$), or other dielectric material based on a desired dielectric constant) is deposited on the surface of the structure 50 via a chemical vapor deposition (CVD), atomic layer deposition (ALD) or other deposition process to a thickness appropriate for forming a dielectric of a vertical three dimensional MIM capacitor. FIG. 9 illustrates the structure of FIG. 8 after undergoing formation of adhesion liners 82 (e.g., titanium nitride (TiN)) alongside each of the voids 78 and a contact material fill 84 (e.g., tungsten (W)) in each of the voids 78 to form a second set of capacitor contacts 86. The adhesion liner 82 and the contact material fill 84 may be formed using any suitable technique as discussed above.

Figure 10:
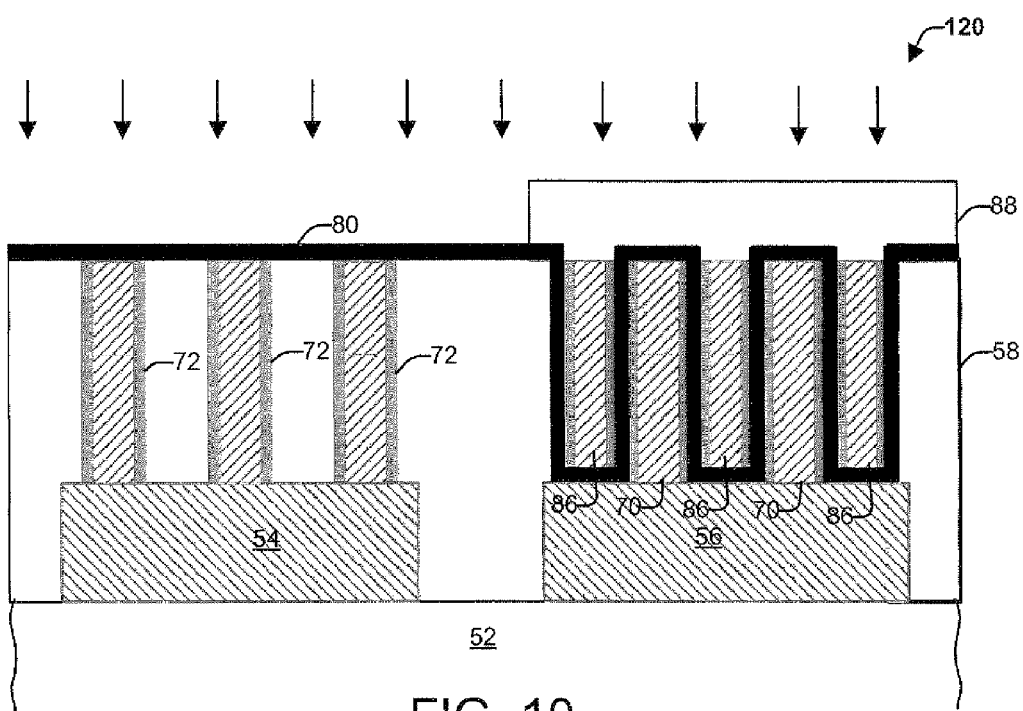
FIG. 10 illustrates a schematic cross-sectional view of the structure of FIG. 9 undergoing an etch step to remove portions of the dielectric material layer in accordance with an aspect of the present invention.

Next, as represented in FIG. 10, a photoresist material layer 88 is applied to the structure 50 and is then patterned and developed to expose the metal interconnect area 51. An etch 120 (e.g., anisotropic reactive ion etching (RIE)) on the dielectric layer 80 is performed to remove portion of the dielectric layer 80 overlaying the metal interconnect area 53 to provide the resultant structure illustrated in FIG. 11.

Figure 11:
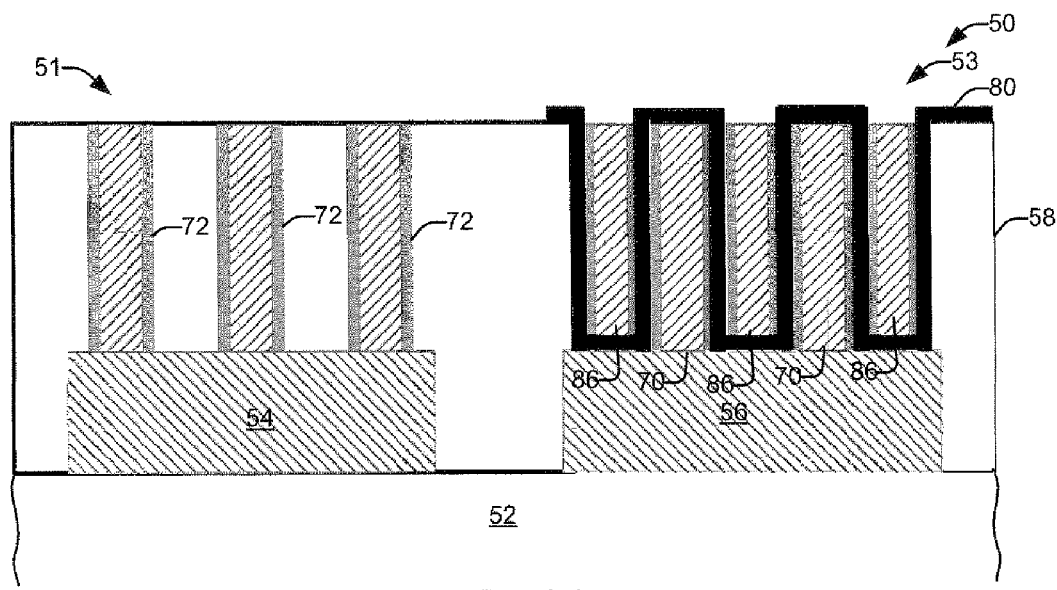
FIG. 11 illustrates a schematic cross-sectional view of the structure of FIG. 10 after undergoing an etch step to remove portions of the dielectric material layer in accordance with an aspect of the present invention.
Figure 12:
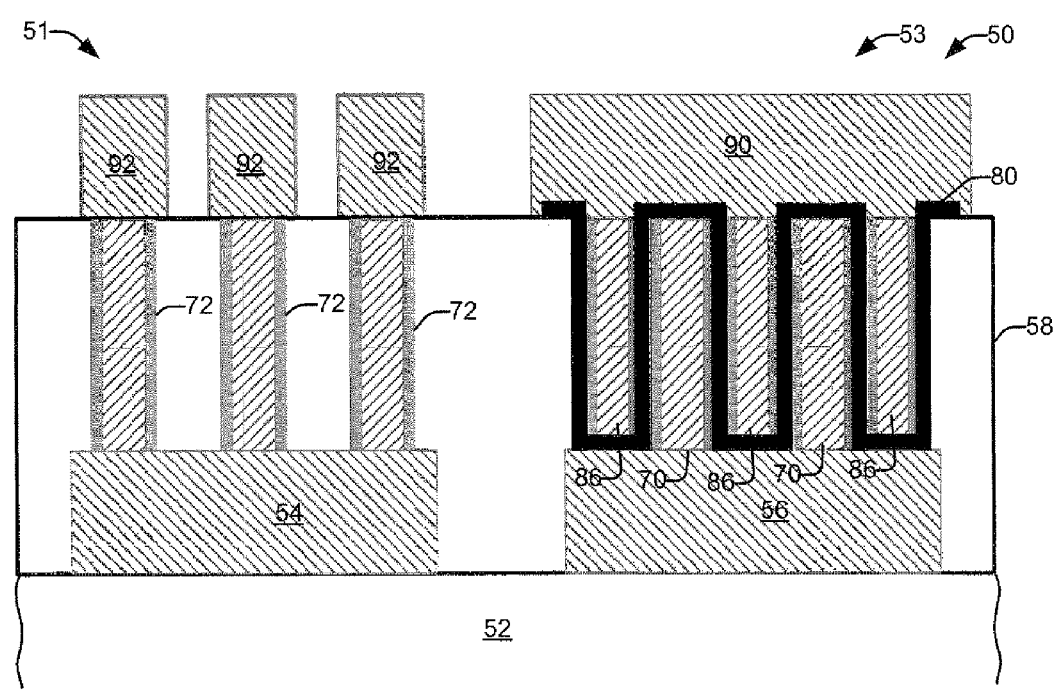
FIG. 12 illustrates a schematic cross-sectional view of the structure of FIG. 11 after formation of a top portion of standard interconnects and a top contact plate in accordance with an aspect of the present invention.

FIG. 12 illustrates the resultant structure of FIG. 11 after formation of a top portion of standard metal interconnects 92 in the standard metal interconnect area 51 and after formation of a top contact plate 90 in the embedded capacitor area 53. The top portion of the standard metal interconnects 92 are coupled to the bottom portion of the standard wiring interconnects 54 via the standard interconnect contacts 72. The top contact plate 90 forms a top electrode for the vertical three dimensional MIM capacitor. The top portion of the standard metal interconnects 92 and the top contact plate 90 can be formed from aluminum that is deposited over the structure of FIG. 11, patterned and etched employing standard photolithography processes as discussed above.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A method of forming a capacitor, the method comprising:
   providing an insulator material layer over a substrate;
   etching at least one via in the insulator material layer;
   forming a given adhesion liner that extends along each of the at least one via;
   depositing a contact material fill over the given adhesion liner and in the at least one via to form a first set of contacts;
   etching the insulator material layer adjacent at least one contact of the first set of contacts to form at least one void;
   depositing a dielectric material layer over the at least one void and over the first set of contacts;
   forming another adhesion liner that extends along each of the at least one void; and
   depositing a contact material fill over the another adhesion liner and in the at least void to form a second set of contacts.

2. The method of claim 1, further comprising forming a first contact plate that is in contact with the first set of contacts and a second contact plate that is in contact with the second set of contacts wherein the first contact plate forms a first electrode of the capacitor, the second contact plate forms a second electrode of the capacitor and the dielectric material layer forms a dielectric material of the capacitor.

3. The method of claim 2, wherein the first contact plate and the second contact plate are formed of aluminum.

4. The method of claim 1, wherein the contact material depositions comprise depositing tungsten (W) in the at least one via and the at least one void and the given and the another adhesion liners are titanium nitride (TiN).

5. The method of claim 1, wherein the dielectric material layer is one of silicon nitride (SiN), hafnium oxide ($HfO_2$), zirconium oxide ($ZrO_2$), and aluminum oxide ($Al_2O_3$)).

6. The method of claim 1, wherein the dielectric material layer wraps around three sides of a contact of the second set of contacts to three sides of a contact of the first set of contacts in an alternating configuration across the length of the capacitor.

7. The method of claim 6, wherein the first set of contacts and the second set of contacts are interleaved with one another.

8. The method of claim 1, further comprising concurrently forming contacts and standard metal interconnects in a standard interconnect area during formation of the capacitor in an embedded capacitor area.

9. A method of forming a semiconductor device with one or more vertical three dimensional metal-insulator-metal (MIM) capacitors, the method comprising:
   providing an insulator material layer over a substrate;
   etching a plurality of capacitor vias in an embedded capacitor area of the insulator material layer and a plurality of standard interconnect vias in a standard interconnect area;
   forming a first plurality of adhesion liners, wherein each of the first plurality of adhesion liners is formed alongside a respective one of the plurality of capacitor vias;
   depositing a contact material fill over each of the first plurality given adhesion liners and in the plurality of capacitor vias to form a first set of capacitor contacts and in the plurality of standard interconnect vias to form a plurality of standard interconnect contacts;
   etching the insulator material layer adjacent each of the first set of contacts to form a plurality of adjacent voids;
   depositing a dielectric material layer over the standard interconnect area, the plurality of adjacent voids and the first set of capacitor contacts;
   etching away the dielectric material layer that overlies the standard interconnect area;
   forming a second plurality of adhesion liners, wherein each of the second plurality of adhesion liners is formed alongside a respective one of the plurality of adjacent voids; and
   depositing a contact material fill over each of the second plurality of adhesion liners in the plurality of voids to form a second set of capacitor contacts that are interleaved with the first set of capacitor contacts.

10. The method of claim 9, further comprising forming a first contact plate that is in contact with the first set of capacitor contacts and a second contact plate that is in contact with the second set of capacitor contacts, wherein the first contact plate forms a first electrode of the capacitor, the second contact plate forms a second electrode of the capacitor and the dielectric material layer forms a dielectric material of the capacitor.

11. The method of claim 10, wherein a first set of standard interconnects and a second set of standard interconnects coupled by the standard interconnect contacts are formed during the formation of the first contact plate and the second contact plate, respectively.

12. The method of claim 10, further comprising forming an adhesion liner alongside each of the plurality of standard interconnect vias prior to the contact material depositions.

13. The method of claim 12, wherein the contact material is tungsten (W), and the dielectric material layer is one of silicon nitride (SiN), hafnium oxide ($HfO_2$), zirconium oxide ($ZrO_2$) and aluminum oxide ($Al_2O_3$).

14. The method of claim 10, wherein the dielectric material layer wraps around three sides of a contact of the second set of capacitor contacts to three sides of a contact of the first set of capacitor contacts in an alternating configuration across the length of a vertical three dimensional MIM capacitor of the one or more vertical three dimensional MIM capacitors.

15. A semiconductor device having a vertical three dimensional metal-insulator-metal (MIM) capacitor, the capacitor comprising:
   a first contact plate;
   a second contact plate;
   a first set of contacts connected to the first contact plate and extending through an insulator layer toward the second contact plate;
   a second set of contacts connected to the second contact plate and extending through the insulator layer toward the first contact plate, such that the first set of contacts and the second set of contacts are interleaved with one another;
   a dielectric material that wraps around three sides of a contact of the second set of contacts to three sides of a contact of the first set of contacts in an alternating configuration across the length of the capacitor; and
   a titanium nitride (TiN) adhesion liner that extends alongside each of the first set of contacts and the second set of contacts.

16. The semiconductor device of claim 15, wherein the first set of contacts and the second set of contacts are formed of (W) and the first contact plate and the second contact plate are formed of aluminum.

17. The semiconductor device of claim 15, wherein the dielectric material is one of silicon nitride (SiN), hafnium oxide ($HfO_2$), zirconium oxide ($ZrO_2$) and aluminum oxide ($Al_2O_3$).

18. The semiconductor device of claim 15, further comprising a first portion of standard metal interconnects connected to a second portion of standard metal interconnects by standard metal contacts that extend through the insulator layer in a standard interconnect area.

* * * * *